United States Patent [19]

Kloker et al.

[11] Patent Number: 4,713,790

[45] Date of Patent: Dec. 15, 1987

[54] EXCLUSIVE OR/NOR GATE HAVING CROSS-COUPLED TRANSISTORS

[75] Inventors: Kevin L. Kloker, Arlington Heights; Ronald H. Cieslak, Chicago, both of Ill.

[73] Assignee: Motorola, Inc., Schaumburg, Ill.

[21] Appl. No.: 760,841

[22] Filed: Jul. 31, 1985

[51] Int. Cl.[4] .................. G06F 7/50; H03K 19/21
[52] U.S. Cl. ........................... 364/784; 307/471; 307/472
[58] Field of Search ............... 364/784; 307/471, 472

[56] References Cited

U.S. PATENT DOCUMENTS

| | | | |
|---|---|---|---|
| 4,041,326 | 8/1977 | Robinson | 307/471 |
| 4,417,161 | 11/1983 | Uya | 307/471 |
| 4,424,460 | 1/1984 | Best | 307/471 |
| 4,575,648 | 3/1986 | Lee | 307/471 |
| 4,601,007 | 7/1986 | Uya et al. | 364/784 |
| 4,621,338 | 11/1986 | Uhlenhoff | 364/784 |
| 4,651,296 | 3/1987 | Koike | 364/784 |

Primary Examiner—David H. Malzahn
Attorney, Agent, or Firm—John A. Fisher; Jeffrey Van Myers; Robert L. King

[57] ABSTRACT

A CMOS exclusive OR/NOR gate is implemented with cross coupled transistors of the same conductivity type for simultaneously providing both logic signals. The logic gate is characterized by a pair of cross-coupled transistors of the same conductivity type coupled to the outputs thereof for selectively reinforcing the output logic level. One use of the exclusive OR/NOR gate is illustrated by coupling the gate to a switched logic circuit to provide a full adder. Transmission gate steering logic is used to further enhance circuit speed.

5 Claims, 1 Drawing Figure

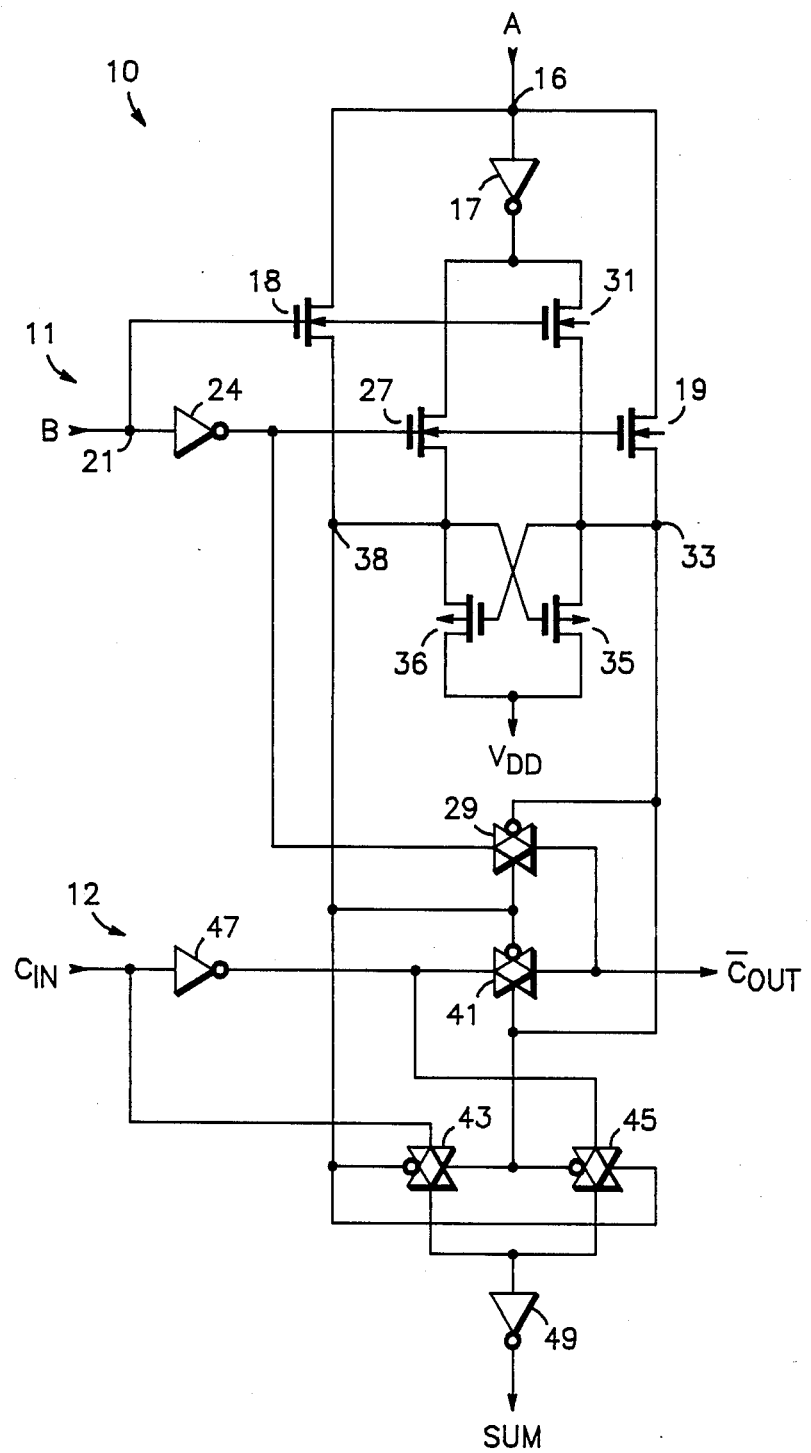

EXCLUSIVE OR/NOR GATE HAVING CROSS-COUPLED TRANSISTORS

TECHNICAL FIELD

This invention relates generally to logic circuits, and more particularly, to an exclusive OR/NOR gate for use in circuits such as full adders.

BACKGROUND ART

Transistor count, speed, power dissipation and layout considerations are typically the most important design criteria when designing logic circuits. CMOS circuits have an inherent power conservation characteristic over single conductivity MOS circuits and are therefore preferable when trying to minimize power consumption. An adder is a circuit which may be implemented with an exclusive OR/NOR circuit to effect an addition operation. A known technique to improve speed in circuits including adders is to increase the physical size of the transistors. However, this technique is not ideal since gate and source-to-drain capacitance of each transistor also increases which degrades speed performance. Since CMOS circuits have complementary transistors, capacitance is typically doubled as compared with single conductivity circuits and is further increased when transistor sizes are increased to improve speed. A known technique to obtain increased speed in an adder circuit is taught by Shively et al. in *Transactions On Computers*, Vol. C-33, No. 7, July 1984, pgs. 677–679, who teach the use of cascaded transfer logic (i.e. transmission gates) to improve the speed of an adder. Transmission gates provide less switching delay than inverting logic circuits. Kanapoulos et al. also teach a full adder circuit in "Design and Implementation of a CMOS Delta Modulator" in *VLSI Design*, February 1985, pgs. 98–101. The full adder taught by Kanapoulos et al. is implemented with an exclusive OR/NOR gate which uses transfer gates and inverters.

BRIEF DESCRIPTION OF THE INVENTION

Accordingly, an object of the present invention is to provide an improved exclusive OR/NOR logic circuit.

Another object of the present invention is to provide an improved exclusive OR/NOR logic circuit which provides substantially simultaneous outputs for use in an adder having improved speed characteristics.

Yet another object of the present invention is to provide an improved exclusive OR/NOR circuit which uses cross coupled transistors.

In carrying out the above and other objects of the present invention, there is provided, in one form, a logic gate for receiving first and second input signals at first and second input terminals, respectively. The logic gate provides exclusive OR and exclusive NOR signals of the input signals substantially simultaneously at first and second output terminals, respectively. First and second inverters respectively receive the first and second input signals. The second input signal biases steering transistors which couple the logic level of the first input signal to one of the output terminals. An inverse logic level is simultaneously coupled to the other output terminal. A pair of cross-coupled single conductivity transistors are coupled to the output terminals for selectively coupling a predetermined power supply voltage terminal to one of the output terminals in response to the input signals. In one form, the logic gate may be coupled to a switched logic circuit for implementing a full adder circuit with the exclusive OR/NOR circuit.

These and other objects, features and advantages will be more clearly understood from the following detailed description taken in conjunction with the accompanying drawing.

BRIEF DESCRIPTION OF THE DRAWING

The single FIGURE illustrates in partial schematic form a full adder circuit in accordance with the present invention.

DETAILED DESCRIPTION OF THE INVENTION

Shown in the single FIGURE is a full adder circuit 10 for adding two input bits labeled A and B, respectively, with a carry input bit labeled $C_{IN}$ to provide a sum output bit and a complement of a carry output bit labeled $\overline{C}_{OUT}$. Adder 10 generally comprises an exclusive OR/NOR gate 11 and a switched logic portion 12. Input bit A is coupled to an input terminal 16. An input of an inverter 17 is connected to input terminal 16. Also connected to input terminal 16 is a drain of each of N-channel transistors 18 and 19. Input bit B is coupled to an input terminal 21. Also connected to input terminal 21 is a gate of transistor 18 and an input of an inverter 24. An output of inverter 24 is connected to a gate of an N-channel transistor 27 and to a first terminal of a CMOS switch 29, commonly referred to as a transmission gate. It should be apparent that the switches illustrated in the single FIGURE may be implemented with any type of switch. A drain of transistor 27 is connected to an output of inverter 17 and to a drain of an N-channel transistor 31. A gate of transistor 31 is connected to the gate of transistor 18, and a gate of transistor 19 is connected to the gate of transistor 27. A source of transistor 19 is connected at an output node 33 to the source of transistor 31, to the source of a P-channel transistor 35 and to the gate of a P-channel transistor 36. A source of transistor 27 is connected at an output node 38 to the source of transistor 18, to the source of transistor 36 and to the gate of transistor 35. Transistors 35 and 36 each have a drain coupled to a power supply voltage $V_{DD}$. An N-channel control electrode of switch 29, a P-channel control electrode of a CMOS switch 41, a P-channel control electrode of a CMOS switch 43 and an N-channel control electrode of a CMOS switch 45 are also connected to node 38. A P-channel control electrode of switch 29, an N-channel control electrode of switch 41, an N-channel control electrode of switch 43 and a P-channel control electrode of switch 45 are connected to node 33. The carry input bit, $C_{IN}$, is coupled to a first terminal of switch 43 and to an input of an inverter 47. An output of inverter 47 is connected to first terminals of switches 41 and 45. A second terminal of switch 41 is connected to a second terminal of switch 29 for providing a carry output bit in complement form. Second terminals of switches 43 and 45 are connected to an input of an inverter 49 having an output for providing the sum output bit labeled "Sum". Although specific N-channel and P-channel MOS devices are shown, it should be clear that adder 10 may be implemented by completely reversing the processing techniques (e.g. P-channel to N-channel) or by using other types of transistors.

In operation, adder 10 functions to provide an output sum bit and an output carry bit in complement form in response to receiving input addends A and B and a carry input bit, $C_{IN}$. Adder 10 operates in accordance with a conventional full adder truth table (not shown) to quickly provide a sum bit and a carry output bit after receiving input bits A, B and $C_{IN}$. An arbitrary example of an input condition will quickly illustrate the operation of adder 10. Assume the input conditions of A=1, B=0 and $C_{IN}$=1. The correct output should be an output sum bit of 0 and a carry output bit of 1(complement is 0). Exclusive OR/NOR gate 11 quickly provides an exclusive OR of input bits A and B at node 33 and an exclusive NOR of bits A and B at node 38. Transistor 19 quickly couples input bit A at node 16 to node 33 in response to a high logic level bias signal at the gate of transistor 19. The signal at node 33 is thus the exclusive OR of bits A and B. It should be noted that if transistor 19 is nonconductive, inverter 17 and transistor 31 function in series to provide the exclusive OR of bits A and B at node 33. In an analogous manner, transistor 18 and inverter 17 which is coupled in series with transistor 27 function simultaneously to quickly provide the exclusive NOR of inputs A and B at node 38. For the chosen input bit values, transistor 18 is nonconductive and transistor 27 is conductive. With the assumed input conditions, transistor 27 quickly couples the inverse logic level of input bit A to node 38 as the exclusive NOR output of bits A and B. It should be noted that when input bit B is a logic one, transistor 18 couples input bit A to node 38 as the exclusive NOR output of bits A and B. Transistors 35 and 36 function as cross-coupled switched pullup transistors for pulling one of either nodes 33 or 38, respectively, quickly to a predetermined power supply voltage potential in response to input bits A and B. Pullup transistors 35 and 36 minimize power dissipation by providing an active pullup on the exclusive OR/NOR outputs to maintain a selective output (node 33 or 38) having a high logic level at substantially the value of the power supply. In the illustrated form, pullup transistors 35 and 36 function to maintain the outputs 33 and 38 at CMOS output levels. Transistors 35 and 36 are of the same conductivity type and have the control electrodes thereof cross-coupled to the opposite output node from which its current electrodes are coupled to. Therefore, only one of the cross-coupled transistors 35 and 36 is conductive at any predetermined time. The ability to use cross-coupled pull-up transistors is made possible by providing both polarities of the exclusive OR function simultaneously. Simultaneous generation of both exclusive OR/NOR logic levels also eliminates an amount of delay in the circuit which would be required to generate an inverse if only one of the logic levels were initially provided. Transistors 35 and 36 remain efficient as small dimensioned transistors to minimize circuit area. Further, transistors 35 and 36 provide a very quick resolution of the logic level of exclusive OR/NOR terminals 33 and 38, respectively.

After the exclusive OR/NOR logic function has been performed on addends A and B, switched logic section 12 completes an addition function. The inverse of the carry output bit is provided as the same logic level of either the inverse of input bit B or the inverse of the carry input bit in response to the value of the exclusive OR/NOR function. If the value of the exclusive OR/NOR function makes switch 29 nonconductive, switch 41 is made conductive and couples the inverse of the carry input bit to the complement output carry bit terminal. Similarly, if the value of the exclusive OR/NOR function makes switch 41 nonconductive, switch 29 is made conductive and couples the inverse of the B input bit to the complement output carry bit terminal. The output sum bit is provided to inverter 49 as either the same logic level of the carry input bit or the inverse thereof in response to the result of the exclusive OR/NOR function of input addends A and B. The use of CMOS switches provides increased speed and permits symmetric circuit layout. Other logic states of a full adder truth table may be readily ascertained and verified in a manner analogous to the previous discussion. It should be well understood that the present invention may be utilized in any application where an exclusive OR/NOR function is desired and is not limited to adder circuits.

By now it should be apparent that an adder circuit which uses a simple and fast exclusive OR/NOR gate has been provided. The use of cross-coupled single conductivity pull-up devices with inverters and transmission gate steering logic provides a very fast adder circuit. General symmetry also permits convenient circuit design layout.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A logic gate for receiving first and second input signals at first and second input terminals, respectively, and providing exclusive OR and exclusive NOR signals of the input signals at first and second output terminals, respectively, comprising:

first inverter means having an input coupled to the first input terminal, and an output;

second inverter means having an input coupled to the second input terminal, and an output;

a first transistor of a first conductivity type having a first current electrode coupled to the output of the first inverter means, a second current electrode coupled to the first output terminal, and a control electrode coupled to the second input terminal;

a second transistor of the first conductivity type having a first current electrode coupled to the first input terminal, a second current electrode coupled to the second output terminal, and a control electrode coupled to the second input terminal;

a third transistor of the first conductivity type having a first current electrode coupled to the first input terminal, a second current electrode coupled to the first output terminal, and a control electrode coupled to the output of the second inverter means;

a fourth transistor of the first conductivity type having a first current electrode coupled to the output of the first inverter means, a second current electrode coupled to the second output terminal, and a control electrode coupled to the output of the second inverter means;

a fifth transistor of a second conductivity type having a first current electrode coupled to the first output terminal, a second current electrode coupled to a terminal for receiving a power supply voltage, and a control electrode coupled to the second output terminal; and a sixth transistor of the second conductivity type having a first current electrode coupled to the second output terminal, a second current electrode coupled to the terminal for receiving the power supply voltage, and a control electrode coupled to the first output terminal.

2. An exclusive OR/NOR logic gate for providing substantially simultaneously an exclusive OR and an exclusive NOR of first and second input signals at first and second output terminals, respectively, comprising:

first inverter means having an input coupled to a first input terminal, and an output;
second inverter means having an input coupled to a second input terminal, and an output;
a first transistor of a first conductivity type having a first current electrode coupled to the output of the first inverter means, a second current electrode coupled to the first output terminal, and a control electrode coupled to the second input terminal;
a second transistor of the first conductivity type having a first current electrode coupled to the first input terminal, a second current electrode coupled to the second output terminal, and a control electrode coupled to the second input terminal;
a third transistor of the first conductivity type having a first current electrode coupled to the first input terminal, a second current electrode coupled to the first output terminal, and a control electrode coupled to the output of the second inverter means;
a fourth transistor of the first conductivity type having a first current electrode coupled to the output of the first inverter means, a second current electrode coupled to the second output terminal, and a control electrode coupled to the output of the second inverter means; and
a pair of transistors of a second conductivity type, each transistor of the pair having first and second current electrodes coupled between a predetermined one of the first or second output terminals and a power supply terminal, and the pair of transistors having the gates thereof cross-coupled, each gate being coupled to a predetermined one of the second or first output terminals, respectively.

3. A logic gate for receiving first and second input signals at first and second input terminals, respectively, and providing exclusive OR and exclusive NOR signals of the input signals at first and second output terminals, respectively, comprising:

first inverter means having an input coupled to the first input terminal, and an output;
second inverter means having an input coupled to the second input terminal, and an output;
a first N-channel transistor having a drain coupled to the output of the first inverter means, a source coupled to the first output terminal, and a gate coupled to the second input terminal;
a second N-channel transistor having a drain coupled to the first input terminal, a source coupled to the second output, and a gate coupled to the second input terminal;
a third N-channel transistor having a drain coupled to the first input terminal, a source coupled to the first output terminal, and a gate coupled to the output of the second inverter means;
a fourth N-channel transistor having a drain coupled to the output of the first inverter means, a source coupled to the second output terminal, and a gate coupled to the output of the second inverter means;
a first P-channel transistor having a source coupled to the first output terminal, a drain coupled to a terminal for receiving a power supply voltage, and a gate coupled to the second output terminal; and
a second P-channel transistor having a source coupled to the second output terminal, a drain coupled to the terminal for receiving the power supply voltage, and a gate coupled to the first output terminal.

4. A full adder circuit implemented with an exclusive OR/NOR logic gate and having first and second input terminals for receiving first and second addends respectively, and a third input terminal for receiving a carry input bit, comprising:

first inverter means having an input coupled to the first input terminal, and an output;
second inverter means having an input coupled to the second input terminal, and an output;
a first transistor of a first conductivity type having a first current electrode coupled to the output of the first inverter means, a second current electrode coupled to a first intermediate node, and a control electrode coupled to the second input terminal;
a second transistor of the first conductivity type having a first current electrode coupled to the first input terminal, a second current electrode coupled to a second intermediate node, and a control electrode coupled to the second input terminal;
a third transistor of the first conductivity type having a first current electrode coupled to the first output terminal, a second current electrode coupled to the first intermediate node, and a control electrode coupled to the output of the second inverter means;
a fourth transistor of the first conductivity type having a first current electrode coupled to the output of the first inverter means, a second current electrode coupled to the second intermediate node, and a control electrode coupled to the output of the second inverter means;
a pair of transistors of a second conductivity type, each transistor of the pair having first and second current electrodes coupled between a predetermined one of the first or second intermediate nodes and a power supply terminal, and the pair of transistors having the gates thereof cross-coupled, each gate being coupled to a predetermined one of the second or first intermediate nodes, respectively;
third inverter means having an input coupled to a carry input terminal for receiving the carry input bit, and an output;
first switching means having a first terminal coupled to the output of the second inverter means, a first control terminal coupled to the first intermediate node, a second control terminal coupled to the second intermediate node, and a second terminal;
second switching means having a first terminal coupled to the output of the third inverter means, a second terminal coupled to the second terminal of the first switching means for providing an inverted carry output signal, a first control terminal coupled to the second intermediate node, and a second control terminal coupled to the first intermediate node;
third switching means having a first terminal coupled to the output of the third inverter means, a second terminal coupled to the second terminal of the third switching means, a first control terminal coupled to the first intermediate node, and a second control terminal coupled to the second intermediate node; and fourth switching means having a first terminal coupled to the output of the third inverter means, a second terminal coupled to the second terminal of the third switching means for providing a complement of the output sum bit, a first control terminal coupled to the first intermediate node, and a second control terminal coupled to the second intermediate node.

5. The full adder circuit of claim 4, further comprising:

fourth inverter means having an input coupled to the second terminals of the third and fourth switching means, and an output for providing an output sum bit of the first and second addends.

* * * * *